United States Patent [19]

Verding et al.

[11] Patent Number: 5,568,355
[45] Date of Patent: Oct. 22, 1996

[54] PCB HOUSING WITH TWO-PART TERMINAL-ACCESS COVER

[75] Inventors: Markus Verding, Dorsten; Thomas Ehm, Dortmund, both of Germany

[73] Assignee: Siemens Aktiengesellschaft, Munich, Germany

[21] Appl. No.: 393,826

[22] Filed: Feb. 24, 1995

[30] Foreign Application Priority Data

Feb. 25, 1994 [DE] Germany .......................... 9403210.6 U

[51] Int. Cl.$^6$ ................. H05K 7/20; H05K 1/14
[52] U.S. Cl. .............. 361/676; 361/728; 361/740; 361/752; 361/759; 361/679
[58] Field of Search ................................. 174/50.51, 55, 174/56, 57; 206/707, 708; 220/3.3, 3.8, 4.09, 4.21, 4.24; 312/185, 188, 223.1, 223.2; 361/676, 679, 678, 683–686, 724, 725, 726, 727, 728, 729, 730–732, 736, 740, 747, 752, 759, 688, 690, 796, 797, 801, 802, 807, 809; 439/55, 61

[56] References Cited

U.S. PATENT DOCUMENTS

| | | | |
|---|---|---|---|
| 4,134,631 | 1/1979 | Conrad et al. | 361/796 |
| 5,187,645 | 2/1993 | Spalding et al. | 361/685 |

*Primary Examiner*—Donald A. Sparks
*Attorney, Agent, or Firm*—Hill, Steadman & Simpson

[57] ABSTRACT

A housing is provided with a base part to receive a plurality of equipment units, such as primed circuit boards. To facilitate access to terminal regions of the circuit boards, a two-part cover is securable to the base part, wherein a first cover part has an access opening to the terminal regions, and a ventilated second cover part covers the terminal region in a snap-fit manner. The terminal regions are thus easily accessible for measuring or testing. Preferably, the second cover part is manually releasable, without use of a tool.

8 Claims, 2 Drawing Sheets

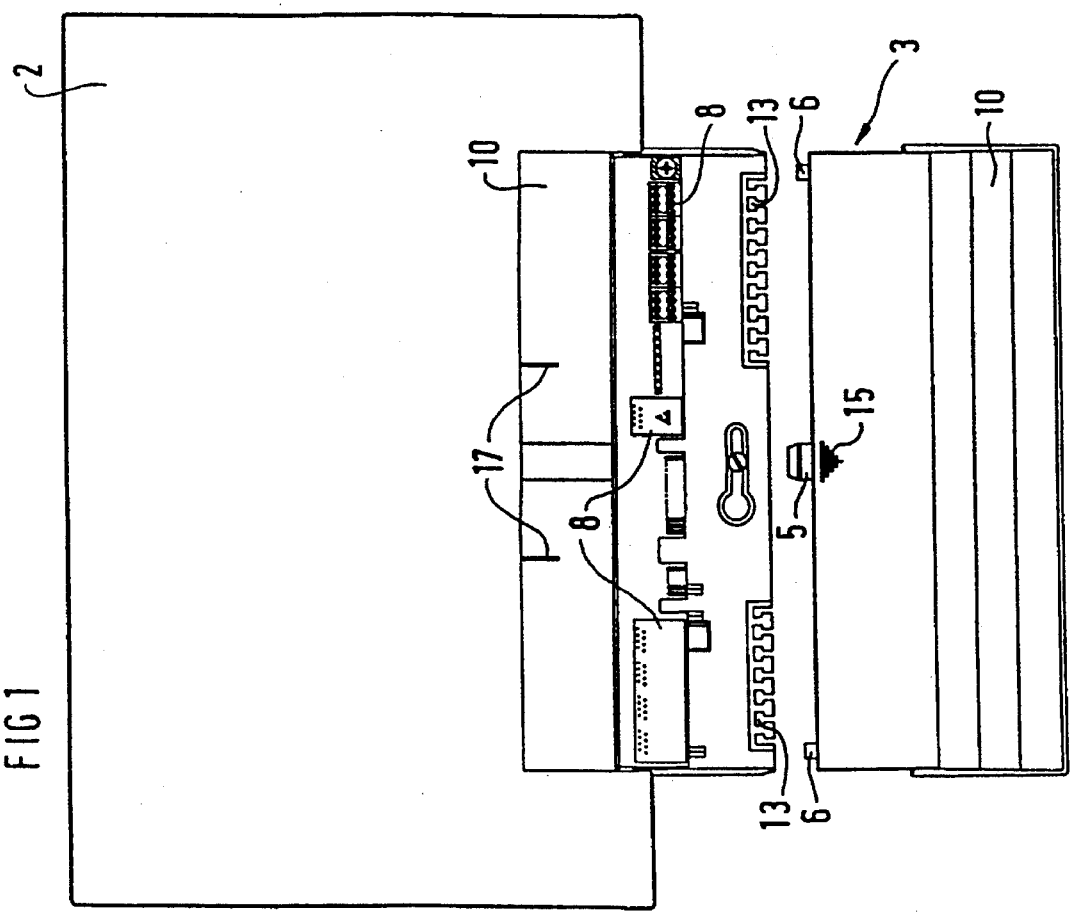

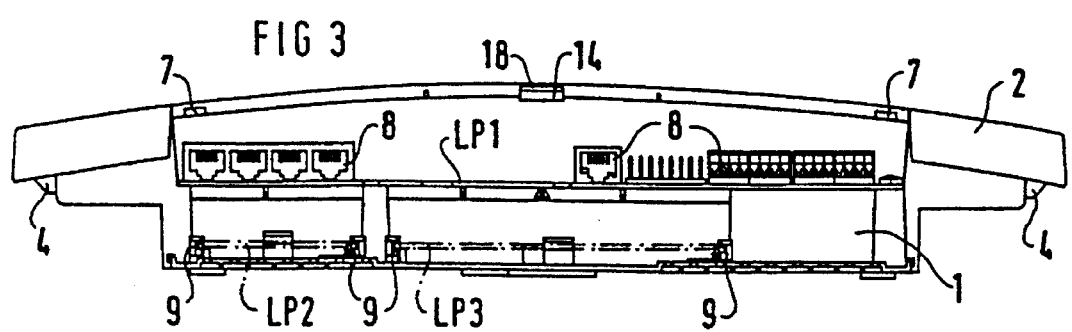

PCB HOUSING WITH TWO-PART TERMINAL-ACCESS COVER

BACKGROUND OF THE INVENTION

The present invention is generally directed to a housing having a base housing part particularly serving to receive printed circuit boards and also having a two-part releasable housing cover provided for an entire, openly accessible region of the properly equipped base housing part. More specifically, the present invention is directed to such a housing having a terminal region accessible from at least one housing side and wherein the equipment of the printed circuit boards at least partially forms a communication system.

Such housings, for example, can be designed as wall housings and contain circuit units for a communication system. These units represent, among other things, equipped printed circuit boards that can be seated in various planes behind one another with reference to a wall housing. A removable housing cover is to assure that access to the individual terminal locations is possible as needed.

SUMMARY OF THE INVENTION

An object of the invention is to provide a housing cover for improved serviceability and to provide necessary access at the terminal side. This is achieved in that the housing cover is formed of a first cover part that covers all but a terminal region, leaving the terminal region openly accessible, and of a second cover part that covers the terminal region after being applied. The second cover part is mechanically releaseably connected to the first cover part.

The terminal region can be defined by the respective edge region of the individual printed circuit boards to which, for example, connector plug elements are attached and that should be accessible for testing and measuring procedures. The individual printed circuit boards within the housing can be connected to one another with appropriate plug-type connectors or individual supply lines or, respectively, leads can be connected therewith. The first cover part covers the base housing part except for one sub-area over the terminals. In order to enable a simple accessibility to the testing, measuring and terminal locations, only the second cover part that covers the sub-area of the terminal region must be removed. When this second cover part is inventively snapped onto the first cover part, then this snap-in connection can be unproblematically undone as needed on the basis of a simple manual manipulation. This is possible without applying a special tool. The employment of a tool can be assumed for the removal of the first cover part that, for example, is latched onto the base housing part.

To this end, a housing is provided having a base housing part which receives a plurality of printed circuit boards. The printed circuit boards have proximally located terminals at a terminal region. A first housing cover part covers the base housing part except the terminal region. A second cover part covers the terminal region and is easily removable from the first cover part to provide access to the terminal region.

In an embodiment, a latch is provided for connecting the first cover part to the base housing part.

In an embodiment, the first cover part is releasable with a tool, however, the second cover part is manually releasable.

In an embodiment, the terminal region is formed by a mutually neighboring edge region of each printed circuit board.

The housing also includes an overlapping region between the second cover part and the first cover part. A catch nose on the second cover part engages an opening in the first cover part to provide the snap-in connection generally at the overlapping region.

The second cover part is tapered, narrowing as the second cover part extends outward over a projecting portion of the terminal region being shaped to have steps. Ventilation slots are provided between the steps to provide aeration to the housing interior. However, the slots are desirably inconspicuous.

In an embodiment, the first cover part is recessed in the overlapping region such that the second cover part secures generally flushly to the first cover part.

In an embodiment, the second cover part further includes sidewalls which respectively cover sidewalls of the base housing part in a coplanar fashion.

In an embodiment, a region of the base housing part covered by the first cover part has a greater width than a region covered by the second cover part. Also, the second cover part projects beyond the first cover part at one side.

In an embodiment, the housing is mountable to a wall.

Additional features and advantages of the present invention are set forth in, and will be apparent from, the detailed description of the presently preferred embodiments and from the drawings.

BRIEF DESCRIPTION OF THE DRAWINGS

The invention shall be set forth in greater detail below with reference to an exemplary embodiment. Shown are:

FIG. 1 illustrates the base housing part covered by a first cover part as well as the second cover part that has not been snapped on.

FIG. 2 illustrates the side view of the housing given a second cover part released according to FIG. 1.

FIG. 3 illustrates the side view of what is the lower side with reference to a wall housing and with the second cover part removed.

DETAILED DESCRIPTION OF THE PRESENTLY PREFERRED EMBODIMENTS

As schematically shown in FIG. 2, the base housing part 1 can be secured to a wall surface 12. The base housing part 1, for example, can accept equipped printed circuit boards with whose equipment a communication system is realized. What is referred to as a small communication system can be accommodated therein, comprising only a slight plurality of communication terminals. Equipped printed circuit boards can be arranged in this base housing 1 in various levels over one another or, respectively, next to one another as well, as shown for the printed circuit boards LP1–LP3 in FIG. 3. The printed circuit board LP1 lies against a frame-like subsurface of the base housing part 1 and can be interlocked in a way that is not shown. The printed circuit board LP2—in the same way as the printed circuit board LP3—can be inserted up to a predetermined detent in guide rails 9 that are joined to a backplane of the housing part 1. They are then likewise automatically interlocked (in a way that is not shown) in this compulsory ultimate position predetermined by the detent.

The lower end regions of the printed circuit boards, in the case of the illustrated wall housing 1, can be provided for the acceptance of the terminal elements 8. These terminal elements 3, which can be plug-type connectors of a wide variety of types, are indicated only for the printed circuit board LP1, but can be provided also on the printed circuit boards LP1 and LP3. This end region of the respective printed circuit boards is generally referred to herein as a terminal region. The individual printed circuit boards can be connected to one another in this region with appropriate plug-type connectors and it is also the region for the lead-in of internal or external lines as well. What are referred to as cable clips can be secured; for example, in incisions 13 of the backplane of the base housing part 1 for these lines. This terminal region should be unproblematically accessible as needed. Such an access is necessary for testing procedures, measuring procedures and for modifications in the line laying.

After the introduction of the printed circuit board LP1 that, for example, fundamentally comprises the critical system components for a communication system, a first cover part 2 can be latched onto the base housing part 1. This latched connection can ensue in a standard way with catch hooks on the cover part 2 which engage with the housing part 1. When the two said parts are joined, the catch hooks are first elastically deflected by corresponding control surfaces and subsequently latch into a locked position at the corresponding interlock shoulders. This latching, for example, can ensue in the shoulder 4 respectively present at the lateral edge. This shoulder 4 can be fashioned such that access for unlocking this catch hook is only possible given employment of an appropriate tool. It can thus also be assured that access to the motherboard, i.e. to the components units contained on the printed circuit board LP1, is not possible without further ado by releasing the first cover part.

As illustrated in FIG. 1, the first cover part 2 does not cover the terminal region of the printed circuit boards. A second cover part 3 that is latched or, respectively, snapped onto the first cover part covers the terminal region. To this end, the second cover part 3 is inserted into a recess of the cover part 2 that has a cooperative shape. An overlap area 10 has two entry bevels 17 in the form of correspondingly wedge-shaped webs, so that a catch nose 5 is introduced into an opening 14 (FIG. 3) of the cover part when the cover part is slipped on and engages behind a correspondingly fashioned interlock shoulder. For reliable guidance, shoulders 6 present at the second cover part 3 are introduced into the corresponding openings 7 (FIG. 3) in the first cover part. The second cover part 3 is guided during its application by the lateral edges of the surface 10 that is depressed compared to the surface of the second cover part 2 and the catch nose 5 is compelled to enter into the opening 14. The elastic catch nose 5 is deflected by the web 18 and snaps it in the interlock position. A manually applied pressure onto the subsurface 15 enables an immediate release of the mechanical connection to the first cover part 2.

With the cover part 3 removed and with the cover part 2 remaining latched in place, it is possible to insert the printed circuit boards LP2 or, respectively, LP3 into the respective guides 9.

As may be seen in FIG. 2, the outer contour of the second cover part 3 is selected such that it tapers downward in steps with reference to the attitude of employment. The surface regions 11 between the individual steps 10 are slotted with the exception of necessary connecting webs. Ventilation is thus possible, although these slots are not highly visible in the ready-to-use assembled condition of the wall housing. The shaping by the contour of this second cover part is thus simultaneously linked to a technological advantage.

In the ready-to-use assembled condition of the wall housing, the terminal region that is formed by the lower edge of the introduced printed circuit boards is accessible at any time in an easy way. The snap-connection can be undone by simply exerting pressure onto the sub-surface 15 provided in the immediate proximity of the catch nose. As a result thereof, namely, the elastic catch nose 5 is bent back, so that the snap-in connection is thereby released and the second cover part can be unproblematically removed. The region of the plug-type connectors 8 is thus accessible at any time so that, for example, re-patchings can be implemented in a simple way. The terminal elements are thus also accessible at any time for measuring procedures or for testing procedures as well.

At least in the overlap region of the second cover part with the first cover part, the surface 10 is stepped :relative to the surface such that the second cover part snapped onto this joins approximately flush with the surface. In the exemplary embodiment, the main area of the housing to be covered by the first cover part 2 comprises a greater width than the region to be covered by the second cover part 3 and this second cover part extends downwardly directed beyond the limiting line of the first cover part. Supported by the undercut for the base housing part that may be seen in FIG. 3, a monitor-like fashioning of the housing is thus achieved overall.

It should be understood that various changes and modifications to the presently preferred embodiments described herein will be apparent to those skilled in the art. Such changes and modifications can be made without departing from the spirit and scope of the present invention and without diminishing its attendant advantages. Therefore, the appended claims are intended to cover such changes and modifications.

What is claimed is:

1. A housing comprising:
    a base housing part for receiving a plurality of printed circuit boards, the printed circuit boards respectively having proximally located terminals at a terminal region;
    a first cover part covering the base housing part except the terminal region; a second cover part covering the terminal region, the second cover part being removable from the first cover part to provide access to the terminal region, wherein the second cover part is releasably secured to the first cover part by a snap-in connection;
    an overlapping region between the second cover part and the first cover part;
    a catch nose on the second cover part; and
    an opening in the first cover part to receive said catch nose to provide the snap-in connection generally at the overlapping region;
    wherein the second cover part is tapered in shape, having steps with ventilation slots being provided between the steps.

2. The housing according to claim 1, further comprising:
    a latch connecting the first cover part to the base housing part.

3. The housing according to claims 1, wherein the first cover part is releasable with a tool and the second cover part is manually releasable.

4. The housing according to claim 1, wherein the terminal region is formed by a mutually neighboring edge region of each printed circuit board.

5. The housing according to claim 1, wherein the first cover part is recessed in the overlapping region such that the second cover part secures in a generally flush manner relative to the first cover part.

6. The housing according to claim 1, wherein the second cover part further comprises sidewalls which respectively cover sidewalls of the base housing part in a planar fashion.

7. The housing according to claim 1, wherein a region of the base housing part covered by the first cover part has a greater width than a region covered by the second cover part, and wherein the second cover part projects beyond the first cover part at one side.

8. The housing according to claim 1, wherein said housing is mountable to a wall.

* * * * *